US009819343B2

(12) United States Patent
Koehne et al.

(10) Patent No.: US 9,819,343 B2
(45) Date of Patent: Nov. 14, 2017

(54) CAPACITIVE TOUCH PANEL

(71) Applicant: SMR Patents S.A.R.L., Luxembourg (LU)

(72) Inventors: Shane Randell Koehne, Lonsdale (AU); Simon David Field, Lonsdale (AU); Brad Alexander Gibson, Lonsdale (AU); Jacob Heath Messenger, Lonsdale (AU)

(73) Assignee: SMR Patents S.A.R.L., Luxembourg (LU)

( * ) Notice: Subject to any disclaimer, the term of this patent is extended or adjusted under 35 U.S.C. 154(b) by 115 days.

(21) Appl. No.: 14/901,422

(22) PCT Filed: Jul. 2, 2014

(86) PCT No.: PCT/IB2014/062782
§ 371 (c)(1),
(2) Date: Dec. 28, 2015

(87) PCT Pub. No.: WO2015/001496
PCT Pub. Date: Jan. 8, 2015

(65) Prior Publication Data
US 2016/0373110 A1    Dec. 22, 2016

Related U.S. Application Data

(60) Provisional application No. PCT/IB2014/062782, filed on Jul. 2, 2014.

(30) Foreign Application Priority Data

Jul. 2, 2013 (AU) ................................ 2013902451

(51) Int. Cl.
*H03K 17/96* (2006.01)
*G06F 3/044* (2006.01)
*F21V 23/04* (2006.01)

(52) U.S. Cl.
CPC ......... *H03K 17/9622* (2013.01); *F21V 23/04* (2013.01); *G06F 3/044* (2013.01);
(Continued)

(58) Field of Classification Search
CPC ..... H03K 17/9622; H03K 2217/96079; H03K 2217/960775; F21V 23/04; G06F 3/044
See application file for complete search history.

(56) References Cited

U.S. PATENT DOCUMENTS

2007/0068789 A1* 3/2007 Streifler ............... H03K 17/962
200/600

FOREIGN PATENT DOCUMENTS

JP       2001195186 A    7/2001

* cited by examiner

*Primary Examiner* — David V Bruce
(74) *Attorney, Agent, or Firm* — MacMillan, Sobanski & Todd LLC (57) ABSTRACT

Disclosed herein is a capacitive touch panel comprising a transparent panel substrate, a front surface of the substrate comprising a conductive translucent layer which, in use, is visible to a user; at least one light source associated with the back surface, wherein the light source is switchable between an 'on' state in which an illuminated icon is visible on the front surface of the cover panel and an 'off' state in which the illuminated icon is not visible on the front surface of the cover panel, wherein the light source is switchable from the off state to the on state by a change in capacitance of the conductive translucent layer; at least one switch associated with the back surface, wherein the switch is activable by a user pressing the touch panel in the vicinity of the illuminated icon to provide an output signal capable of performing a function.

20 Claims, 4 Drawing Sheets (52) U.S. Cl.
CPC .............. *H03K 2217/96079* (2013.01); *H03K 2217/960755* (2013.01); *H03K 2217/960775* (2013.01)

CAPACITIVE TOUCH PANEL

PRIORITY DOCUMENTS

The present application is a national stage application filed under 35 U.S.C. §371 of international application PCT/IB2014/062782 filed on Jul. 2, 2014, published; which claims priority from Australian Provisional Patent Application No. 2013902451 titled "CAPACITIVE TOUCH PANEL" which was filed on 2 Jul. 2013. All of the aforementioned applications are hereby incorporated by reference in their entirety.

TECHNICAL FIELD

The present disclosure relates generally to capacitive touch panels for use in automotive and domestic applications. More particularly, the present disclosure relates to capacitive touch panels having a conductive metallic visual surface.

BACKGROUND

Touch panels having icons that can be pressed to perform a function such as switching on a light or fan are becoming more desirable in domestic, building, and automotive applications, such as household appliances, vehicle heating controls, and the like. Typically, the touch panels have a relatively uncluttered surface with one or more icons (that may or may not be back lit) visible on the surface at all times or visible when illuminated. In use, a user is able to touch the icon to activate an electronic switch, which then performs a function. These touch panels have advantages over traditional panels featuring mechanical switches through the provision of a less cluttered visual appearance.

Two common technologies used for touch panels are surface capacitance and projected capacitance. Surface capacitance works on the basis of a person creating a path for an electrical current to ground. When the touch screen is touched, current will flow through the person's finger to ground. One side of an insulator is coated with a conductive layer. A small voltage is applied to the layer resulting in a uniform electrostatic field. A sensor can determine the location of the touch directly from the change in capacitance measured from the four corners of the panel. The greater the change in any corner, the closer the touch is to that corner. However, surface capacitance technology provides limited positional resolution, requires calibration during manufacture, does not work if a user is wearing gloves and is difficult to implement on geometrically complex parts.

Projected capacitance panels are frequently used on tablets and smartphones and incorporate a grid of transparent conductive material, such as indium tin oxide (ITO), organised into rows and columns. A voltage applied to the grid creates a uniform electrostatic field and when a conductive object, such as a finger, comes into contact with the panel, it increases the capacitive load at that point. Capacitive panels are normally transparent and to date it has not been possible to use them to provide an aesthetically pleasing continuous metallic surface with touch functionality in an appliance or vehicle interior trim component. This is because the continuous metallic surface capacitively couples to the transparent conductive grid and the resultant large parasitic capacitance makes it very difficult to detect a small capacitance increase due to the touch of a user.

It would be beneficial to provide an aesthetically pleasing touch panel that appears as a continuous metal surface whilst providing hidden until lit icons and discrete switching capability associated with the icons.

SUMMARY

According to a first aspect, there is provided a capacitive touch panel comprising a transparent or translucent panel substrate, a front surface of the substrate comprising a continuous conductive transparent or translucent metal layer, which, in use, is visible to a user; at least one light source associated with a back surface of the substrate, wherein said light source is switchable between an 'on' state in which an illuminated icon is visible on the front surface of the panel and an 'off' state in which the illuminated icon is not visible on the front surface of the panel.

Preferably, the front surface of the substrate has a substantially continuous, uniform appearance with no visible icons when the light source is in the off state.

At least one switch may be associated with the back surface of the substrate. The switch is able to be activated by a user pressing the touch panel in the vicinity of an illuminated icon to provide an output signal capable of performing a function.

In embodiments, the light source is switchable from the off state to the on state by a detected change in capacitance of the conductive transparent or translucent metal layer. For example, a detectable change in capacitance may arise when an object that is able to capacitively couple to the conductive translucent layer, such as a user's finger, is placed in the proximity of, or touches the conductive transparent or translucent metal layer.

In embodiments, the conductive transparent or translucent metal layer is formed from a material selected from the group consisting of: chromium, aluminium, titanium, nickel, molybdenum, zirconium, tungsten, silicon, niobium, tantalum, cobalt, manganese, silver, zinc, and mixtures thereof; and an oxide, nitride, boride or carbide thereof and mixtures thereof.

The conductive transparent or translucent metal layer may have a minimum light transmission of 5% to a maximum of 100%. In some embodiments, the light transmission of the conductive transparent or translucent metal layer is from 5% to 20%. In specific embodiments, the light transmission of the conductive transparent or translucent metal layer is about 8%.

In embodiments, the front surface of the substrate is a polished, textured or machined surface. When the conductive transparent or translucent metal layer is deposited on a polished, textured or machined substrate surface it provides a visible surface that is either a highly polished metal looking surface or a textured metal surface that replicates metal finishing, for example brushed stainless steel. These embodiments therefore provide a touch panel having a visible, continuous metallic surface finish with backlit icons that are non-visible when the light source is in the off state and become visible when illuminated and have functionality to provide an output signal when the visible metallic surface is touched by a user.

In embodiments, the one or more switches associated with the back surface are capacitive switches that are activated by the deflection of a surface. In these embodiments, each capacitive switch comprises two conductive pads or surfaces that are spaced from one another and which, when one of the pads or surfaces is deflected toward the other pad or surface, the change of capacitance resulting from the deflection is monitored and measured. Once the detected change in capacitance exceeds a predetermined threshold, an output signal is produced. In embodiments, a first of the conductive pads or surfaces of the capacitive switch is translucent and a second of the conductive pads or surfaces is opaque but contains a translucent section in the form of the icon which is illuminated by the light source.

In use, when a user presses on the touch panel over an illuminated icon the second conductive pad or surface will be deflected toward the first conductive pad or surface, resulting in a change of capacitance and generation of an output signal.

The output signal may be used to perform a wide variety of functions such as switching on a light in an appliance or a vehicle, switching on a fan in an appliance or a vehicle or operating a motor such as an electric window motor in a vehicle, etc. A typical example of use would be a vehicle interior featuring a rear vision mirror switch, which appears as a metallic surface in its default state but, upon a touch by a user, switches to a 'ready' state in which various function icons or symbols, such as mirror up, down, left, and right, become illuminated from behind. When these individual icons are touched in the ready state, the touch is sensed by the unit and an output signal is sent to adjust the mirror in the desired manner.

It will be appreciated that the switch is not visible to a user from the front surface of the touch panel and, in preferred embodiments, the front surface of the panel contains no visible icons, indicia, tell-tales, symbols or the like until the light source is illuminated.

The light source may be a light emitting diode (LED), organic light emitting diode (OLED) or surface lit plastic sheet, such as Acrylite® (Evonik Industries). A change in intensity and/or colour of the light from the light source may be used to indicate that the associated switch has been activated.

The light source may be located in a light channel, which, when the light source is on, directs light towards the back surface of the substrate. The back surface of the substrate may contain an opaque coating layer. In this opaque layer, icons, tell-tales, indicia and/or symbols are formed in the coating directly over the light channel so that light can pass through the icons, tell-tales, indicia and/or symbols, and be incident upon the capacitive translucent layer.

In embodiments, the illuminated icons, tell-tales, indicia and/or symbols, and corresponding switches are located in an operating region of the touch panel, wherein the substrate at the operating region is substantially more flexible than the remainder of the substrate. For example, the substrate at the operating region may be thinner and, therefore, more flexible than the remainder of the substrate. Alternatively, the substrate may have a relatively uniform thickness across its entire length and may be unsupported and hence relatively flexible in the operating regions, and supported by a frame or similar for the remainder of the substrate.

BRIEF DESCRIPTION OF THE FIGURES

Embodiments of the present invention will be discussed with reference to the accompanying figures.

In the following description, like reference characters designate like or corresponding parts throughout the figures.

DESCRIPTION OF EMBODIMENTS

Figure 1:
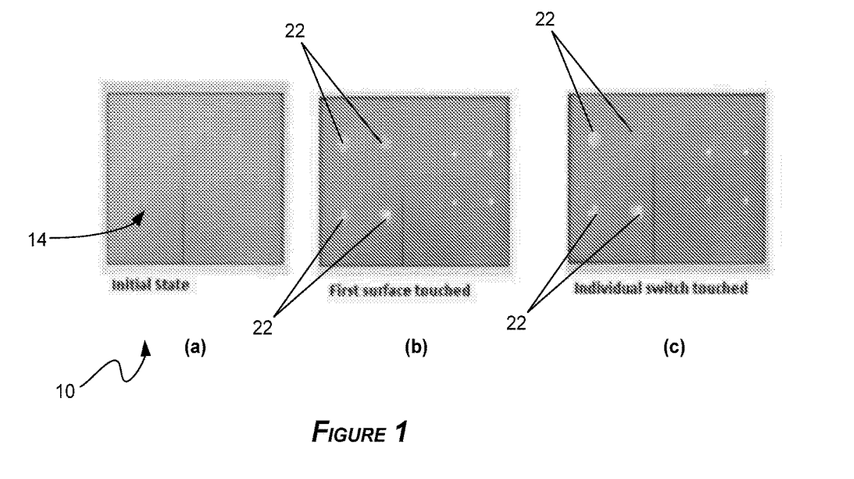
FIG. 1 shows photographs of a touch panel of an embodiment of the invention in (a) an inactive initial state; (b) an intermediary state in which all icons are illuminated; and (c) an active state after the panel has been pressed in the region of one of the illuminated icons.

The figures show embodiments of a capacitive touch panel 10 comprising a transparent or translucent panel substrate 12. A front surface 14 of the substrate 12 comprises a conductive transparent or translucent metal layer 16 which, in use, is visible to a user. At least one light source 18 is associated with a back surface 20 of the substrate 12. The light source 18 is switchable between an on state in which an illuminated icon 22 is visible on the front surface 14 of the panel 10 and an off state in which no icon is visible on the front surface 14. In the embodiment shown in FIG. 1 there are four icons 22, each having a separate light source 18. However, any number and/or arrangement of icons 22 could be used.

Each icon 22 is associated with a switch 24 that is located adjacent the back surface 20. Each switch 24 is activable by a user pressing the touch panel 10 in the vicinity of the corresponding illuminated icon 22 to provide an output signal capable of performing a function.

The light sources 18 are switchable from the off state to the on state by a detected change in capacitance of the conductive transparent or translucent metal layer 16. The change in capacitance is caused by a conductive object, such as a finger, capacitively coupling to the conductive transparent or translucent metal layer 16. A conductive object can capacitively couple to the conductive transparent or translucent metal layer 16 by touching the front surface 14 of the substrate 12 or by being placed within the proximity of the front surface 14 (without physically touching the front surface 14). Once a change in capacitance is detected, a signal to switch the light sources 18 to the on state is generated and the icons 22 are illuminated and become visible on the front surface 14.

Alternatively, the light sources 18 could be activated by other means, such as by a switch that could be activated by, for example, a user inserting a key into the ignition of a vehicle or by a sensor in the driver's seat of a vehicle which is activated when a person sits on the seat.

The substrate 12 can be formed from any transparent or translucent material. Plastics, such as polycarbonate or acrylic are particularly suitable. The substrate 12 is formed into a desired shape by moulding and/or other forming techniques. In the illustrated embodiments, the substrate 12 is generally planar and rectangular in plan view however, it will be appreciated that it may be any suitable shape or curvature depending on the intended end use.

Figure 2:
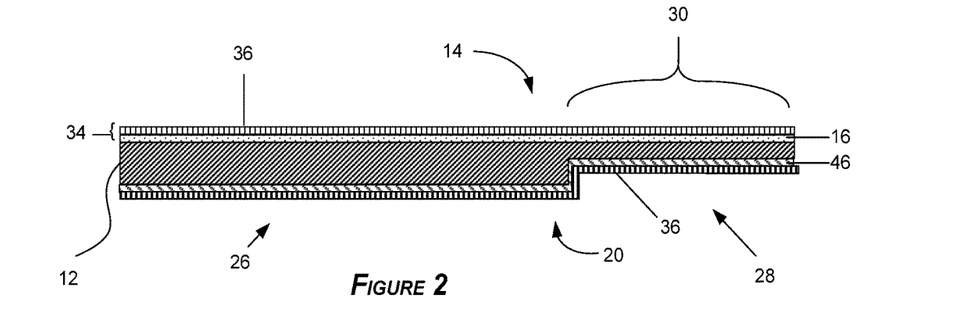
FIG. 2 shows a cross sectional schematic view of a touch panel substrate of an embodiment of the invention.
Figure 4:
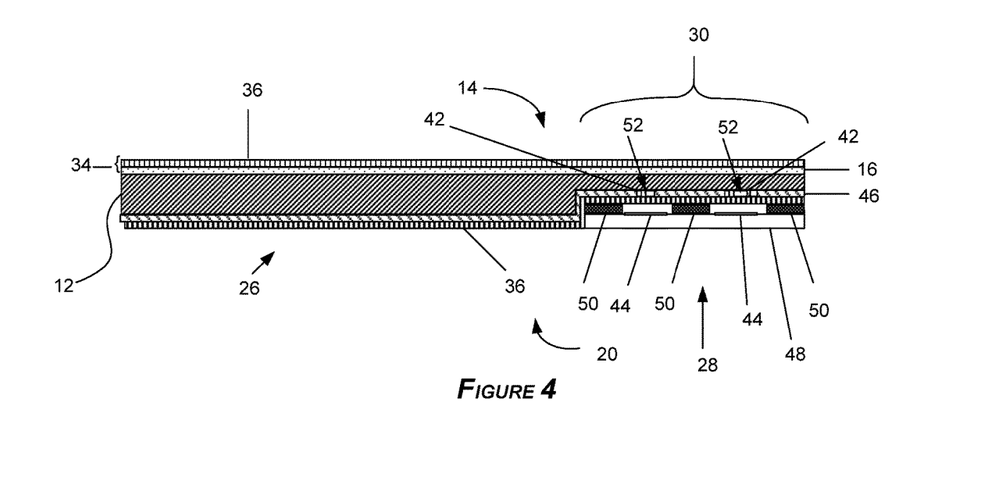
FIG. 4 shows a cross sectional schematic view of the touch panel substrate shown in FIG. 2 with associated capacitive switches on the back surface.
Figure 5:
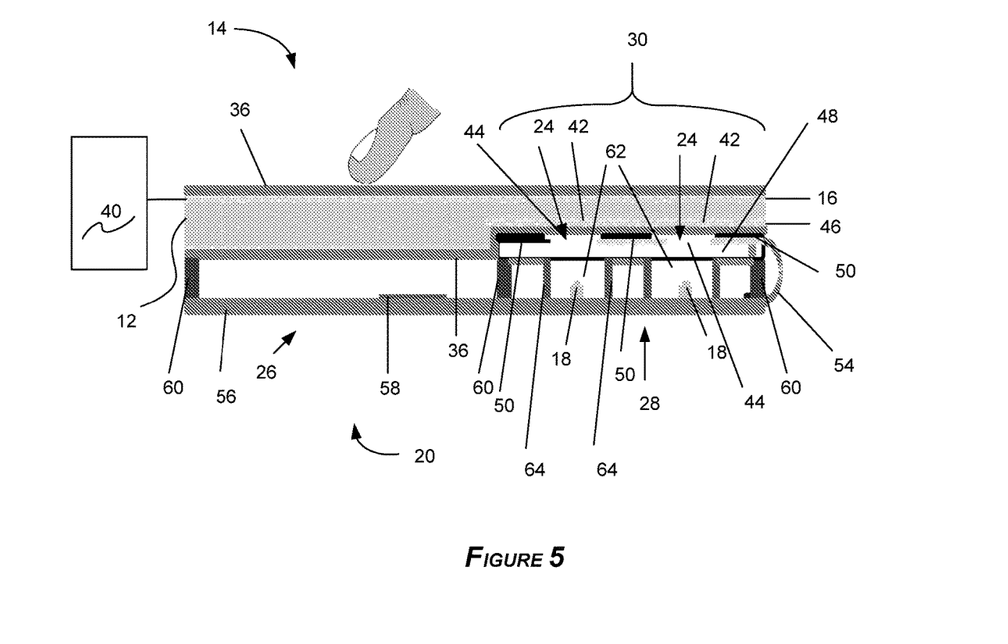
FIG. 5 shows a cross sectional schematic view of an assembled touch panel comprising the touch panel substrate shown in FIG. 2 with associated capacitive switches and PCB on the back surface.

As best seen in FIGS. 2, 4, and 5, in some embodiments the substrate 12 comprises a first section 26 and a second section 28. The first section 26 is thicker in cross section than the second section 28. The substrate at the second section 28 is more flexible than the substrate at the first section 26 to allow for deflection of the substrate at the second section 28 when a small force is applied, such as when a user touches the panel 10. The thinner second section 28 can be formed into the substrate 12, moulded into the substrate 12 or it can be machined into the substrate 12. The second section 28 forms an operating region 30 in which the icons 22 and switches 24 are located.

Figure 3:
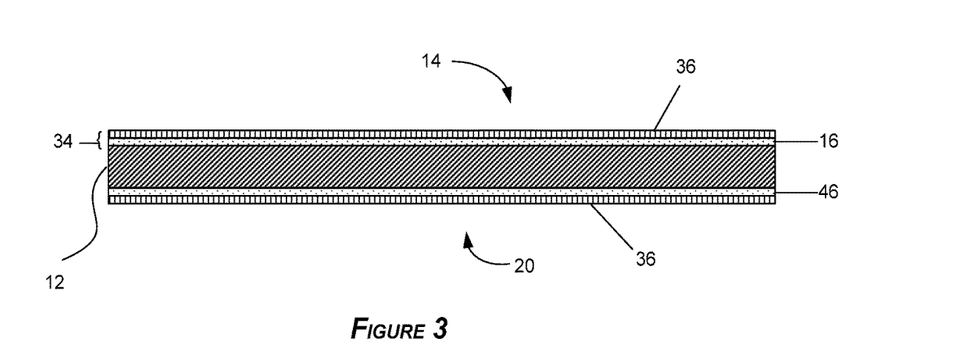
FIG. 3 shows a cross sectional schematic view of a touch panel substrate of another embodiment of the invention.
Figure 6:
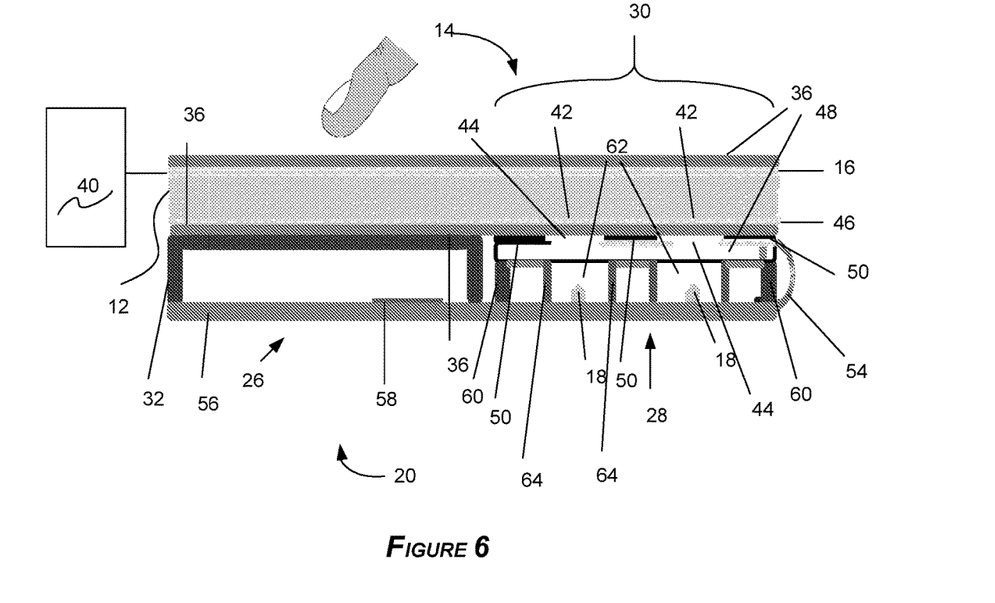
FIG. 6 shows a cross sectional schematic view of an assembled touch panel comprising the touch panel substrate shown in FIG. 3 with associated capacitive switches and PCB on the back surface.

In alternative embodiments shown in FIGS. 3 and 6, the substrate 12 has a relatively uniform thickness in cross section and the first section 26 is supported by a support frame 32 so that it is less flexible than the remainder of the substrate which forms the second section 28 or operating region 30.

The conductive transparent or translucent metal layer 16 is formed from a metal, alloy or conductive metalloid. As used herein, the term "metal layer" includes layers of metal, conductive alloy or conductive metalloid. Suitable metals include chromium, aluminium, titanium, nickel, molybdenum, zirconium, tungsten, niobium, tantalum, cobalt, manganese, silver, zinc, mixtures of any of the aforementioned, oxides of any of the aforementioned, nitrides of any of the aforementioned, borides of any of the aforementioned, carbides of any of the aforementioned, and alloys of any of the aforementioned metals. Suitable alloys include steel and stainless steel. Suitable conductive metalloids include silicon.

The front surface 14 of the substrate 12 can be highly polished or contain a texture so that when the metal layer 16 is deposited, the surface resembles a metal-look finish such as brushed stainless steel. As such, the conductive transparent or translucent metal layer 16 meets aesthetic and durability requirements of users within the automotive, domestic and building industries. The desired texture can be applied to a mould and/or forming tool and transferred to the front surface 14 during the manufacturing process.

The conductive transparent or translucent metal layer 16 can be deposited using any suitable elemental deposition technique, including Physical Vapour Deposition (PVD), Chemical Vapour Deposition (CVD), or the like. More particularly, the substrate 12 may be positioned in one or more sputter deposition chambers with either planar or rotary magnetron targets, and with deposition of the transparent or translucent metal layer 16 being achieved via DC sputtering from an elemental target. Other processes for applying or depositing layers of metallic layers can also be used. The conductive transparent or translucent metal layer 16 may be deposited or applied to the entire front surface 14 of substrate 12. The thickness of the metal layer 16 will determine the transparency or translucency of the layer. It has been found that a thickness of 2 nm to 50 nm provides a conductive transparent or translucent metal layer 16 that allows sufficient light to pass through so that the illuminated icon 22 is visible from the front surface 14 even though the light source 18 is located at the back surface 20 of the substrate 12. A thickness of about 30 nm is particularly suitable.

The light transmission of the conductive transparent or translucent metal layer 16 is preferably between 5% and 20%, such as 5%, 6%, 7%, 8%, 9%, 10%, 11%, 12%, 13%, 14%, 15%, 16%, 17%, 18%, 19% or 20%. In specific embodiments, the light transmission of the conductive transparent or translucent metal layer 16 is about 8%. At these levels of translucency, when the light source(s) 18 is/are off, there is no visible icon, indicia or other symbol visible on the front surface 14. This means that the panel 10 has a 'dead' frontal appearance and continuous metal-look finish when the icon(s) 22 is/are not illuminated. However, for certain applications it may be desirable for the conductive transparent or translucent metal layer 16 to be completely transparent.

Figure 8:
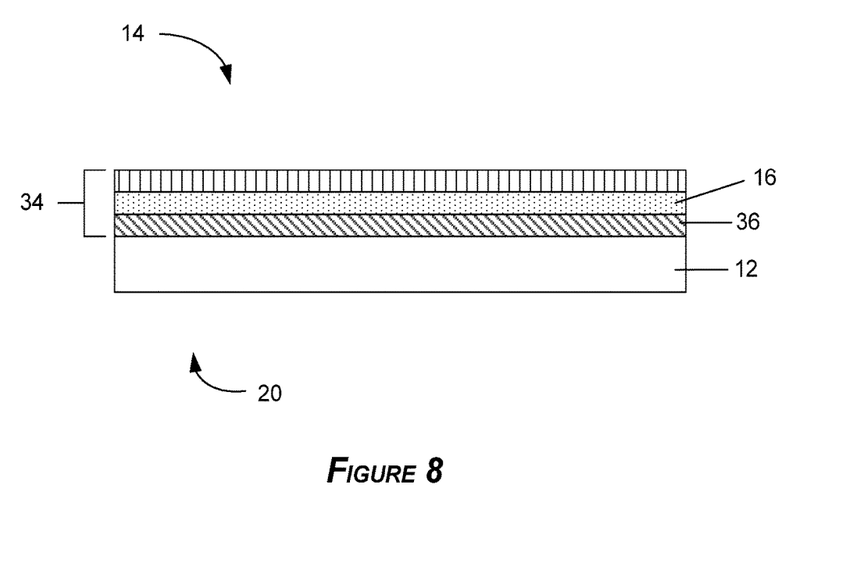
FIG. 8 shows a cross sectional schematic view of a touch panel substrate of an embodiment of the invention.

As shown in FIGS. 2, 3, and 8 the conductive transparent or translucent metal layer 16 may be part of a multilayer transparent or translucent stack 34 on the front surface 14 of the substrate 12. The multilayer stack may comprise other layers such as hard coat layers, and the like. For example, a hard coat 36 can be applied to the substrate 12 either on top of the conductive transparent or translucent metal layer 16 (FIG. 2) or between the substrate 12 and the conductive transparent or translucent metal layer 16 (FIG. 8).

The hard coat 36 is formed from one or more abrasion resistant layers. As is known in the art, a primer layer may be used between the hard coat 36 and the substrate 12 or conductive transparent or translucent metal layer 16 to enhance adhesion of the hard coat 36. The hard coat 36 can be formed from one or more of a range of materials known for this purpose in the art, including an organo-silicon, an acrylic, a urethane, a melamine or an amorphous organo-silicon ($SiO_xC_yH_z$). Organosilicon hard coats are particularly suitable and suitable materials include Silicone Hard Coat SHC 5020 from Momentive and GE587B from MomentiveGE Bayer. The hard coating material may be applied in a solvent, such as an alcohol solvent. The hard coat 36 can be applied using any of the coating techniques known in the art, including flow coating, dip coating, spray coating, spin coating, etc. and then cured using techniques known in the art, such as heating to a temperature of about 100° C. to about 200° C. for the appropriate required period of time.

Intermediate layers 38 may be deposited between the respective layers of the multilayer stack 34. The intermediate layers 38 may assist in adhesion between the respective layers and minimise or prevent delamination. The intermediate layers 38 will generally be translucent and may be formed from silica.

Optionally, the front surface 14 may also be coated with other functional layers, such as anti-glare coatings, anti-fingerprint coatings, hydrophobic coatings or diffuse surface coatings.

During use of the touch panel 10, a user may touch the front surface 14 such that the user's finger capacitively couples with the conductive translucent layer 16. The capacitive coupling may be through the hard coat 36 and/or intermediate layers 38. A detector 40 then measures the change in capacitance, as is known in the art. The detected change in capacitance produces an output signal from the detector, which triggers the illumination of the light sources 18, as subsequently described in more detail.

Figure 7:
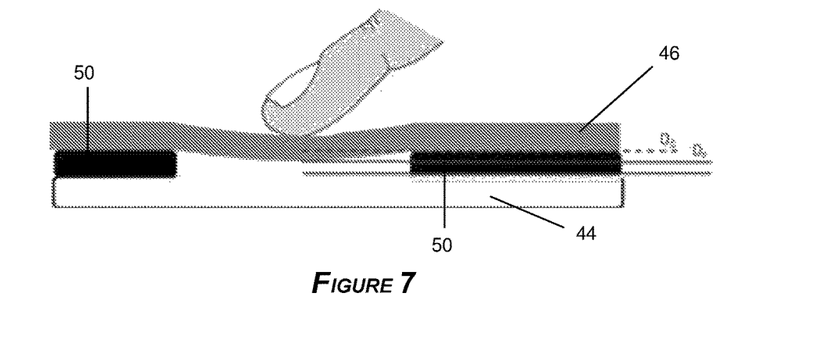
FIG. 7 shows a cross sectional schematic view showing the operation of a capacitive switch.

The switches 24 are capacitive switches that are activated by the deflection of a surface. Each capacitive switch comprises two conductive pads or surfaces 42 and 44 that are spaced from one another and which, when one of the pads or surfaces 42 is deflected toward the other pad or surface 44 the change of capacitance resulting from the deflection is monitored and measured. Once the detected change in capacitance exceeds an established threshold the output signal is produced. One of the conductive pads or surfaces 44 of the capacitive switch 24 is translucent whilst the other conductive pads or surfaces 42 is opaque but contains a translucent section in the form of the icon 22 which is illuminated by the light source 18.

As the switch 24 is dependent on deflection of the surface 42 and the deflection of the surface is dependent on the force applied by a user, the switch 24 thresholds can be tuned based on application of force. For example, the switch 24 could trigger when a small deflection or force is exerted and provide a secondary trigger if the deflection and force is further increased. This could be used on speed related functions such as exterior mirror adjustment. In this example, the more force that is applied to the switch 24, the more the surface deflects and the faster the exterior mirror adjusts.

In the illustrated embodiments, the first conductive pad 42 of each of the capacitive switches 24 is part of a substantially continuous conductive opaque layer 46 on the back surface 20 of the substrate 12. The conductive, opaque layer 46 does not allow transmission of light from the light source(s) 18 located behind the layer 46 to any substantial extent. The conductive opaque layer 46 is preferably a metallic layer. Again, as used herein the term "metallic layer" includes layers of metal, conductive metalloids and/or conductive alloys. Conductive metals which are suitable for this purpose include copper, aluminium, and silver. Conductive alloys which are suitable for this purpose include chrome zirconium alloy. The metallic layer may also consist of successive layers of copper and chrome. The conductive opaque layer 46 can be deposited on the back surface 20, directly or indirectly, by any suitable process such as sputtering or vapour deposition. The metal layer of the conductive opaque layer 46 may have a thickness of 70 nm.

The conductive, opaque layer 46 may be part of a multilayer stack formed on the back surface 20. For example, a hard coat 36 may cover the conductive opaque layer 46 on the back surface 20. The hard coat 36 may be applied to all or part of the substrate 12. The thickness of the conductive, opaque layer stack may be about 460 nm.

The second pad or surface 44 is translucent and conductive. The second pad or surface 44 is positioned adjacent the back surface 20 at the operating region 30. The second pad or surface 44 is an Indium Tin Oxide (ITO) pad (or a similar translucent conductive material) and each pad 44 is positioned directly below the translucent section that forms the icon 22. One second pad 44 is associated with each icon 22 that is associated with a switching function. The second pads 44 are formed on a translucent touch pad substrate 48, which is formed from a suitable translucent material such as polycarbonate, acrylic or glass. The pad(s) 44 are formed via deposition directly onto the touch pad substrate 48. Alternatively, the pad(s) 44 can be deposited onto a thin translucent film, such as a Polyethylene-terephthalate (PET) film, which is then adhered to the touch pad substrate 48. The touch pad assembly is attached to the back surface 20 of the substrate 12 at the thinner second section 28. In embodiments in which the substrate 12 does not have a thinner section (i.e. has a relatively constant thickness cross section) the touch pad assembly is attached to the back surface 20 underneath the icons 22. The touch pad substrate 48 can be attached to the back surface 20 using any suitable means. In the illustrated embodiments, the touch pad substrate 48 is attached to the back surface 20 using double sided adhesive with die spacers 50. The touch pad substrate 48 can be shaped or curved to match the form of the visual surface.

As discussed, the conductive opaque layer 46 has one or more translucent patterns 52 each in the desired shape of an icon 22. The translucent patterns 52 are located in the operating region 30 and allow light transmission from the light source(s) 18 therethrough. The translucent patterns 52 can be formed in the opaque layer 46 by laser ablation or by suitable masking when the opaque layer 46 is deposited. Etching processes known in the art could also be used for this purpose. Light from the light source 18 is able to pass through the translucent patterns 52 so that the corresponding icon 22 is visible from the front surface 14 when the light source 18 is illuminated. In the illustrated embodiments, there is more than one translucent pattern 52 formed in the opaque layer 46 with each pattern 52 being different and in the shape of a specific icon 22. Each icon 22 represents a function that can be activated by a user pressing the touch panel 10 over an illuminated icon 22 to produce an output signal. If, in forming the translucent pattern 52, an excessive amount of conductive material is removed, the conductive opaque layer 46 can be coated with a transparent or translucent conductive material.

It will be appreciated that the translucent patterns 52 can be formed on either of the two conductive pads or surfaces 42 and 44 of the capacitive switch 24. For example, the translucent patterns 52 could be formed on the second conductive pad or surface 44 and the first pad or surface 42 may be transparent or translucent so that light passing through the second pad or surface 44 also passes through the first pad or surface 42.

Electrical connectors 54 connect each capacitive switch 24 to a Printed Circuit Board (PCB) 56, which contains a microcontroller and LED light sources 18. The electrical connectors 54 may be flex tail connectors that are electrically connected to the PCB 56 using Zero Insertion Force (ZIF) connectors or similar.

One or more spacers 50 are positioned between the top of the second pads 44 and the conductive, opaque layer 46. The spacer(s) 50 maintain a small gap between the conductive touch pads 44 and the conductive opaque layer 46. When a user presses the panel 10 in the region of an illuminated icon 22 the touch is measured using substrate deflection between the conductive touch pad 44 and the conductive opaque layer 46. Specifically, as the surface deflects there is a capacitance change between the touch pad 44 and the conductive opaque layer 46 and it is this capacitive change which is detected and processed by a processor 58 capable of discerning the small change in capacitance. The processor 58 is part of the PCB 56. The PCB 56 is attached to the back surface 20 of the substrate 12 via a plurality of stand-offs 60, which hold the PCB 56 in a spaced arrangement with respect to the substrate 12.

Each capacitive switch 24 is associated with a light source 18 which illuminates the icon 22 associated with the corresponding switch 24 when required. Light emitting diodes (LEDs) are particularly suitable for use as the light sources 18. Other suitable light sources include organic light emitting diodes (OLEDs) and surface- or edge-lit plastic sheet, columns and the like such as Acrylite® plastic materials available from Evonik Industries. Each icon 22 may be illuminated with one LED or with a group of LEDs. In embodiments in which there is more than one icon 22, there is a single group of LEDs (one or more LEDs in each group) 18 for each icon 22, thereby allowing each icon 22 to be illuminated and coloured individually. Each group of LEDs 18 provides a homogenous light and illuminates a single icon 22 which is then visible to a user when looking at the front surface 12 of the panel 10. Alternatively, multiple icons 22 can be illuminated using the same LED light source(s) 18 and/or a diffusing light guide if the icons are homogenously illuminated at the same time.

Optionally, each capacitive switch 24 may also be associated with means for providing haptic or audio feedback to the user. Haptic feedback may be provided by way of a vibration created by a vibrator, a low-frequency sound produced by a speaker, or the like.

To minimise stray light from one group of LEDs illuminating an adjacent icon 22, each group of LEDs may be located in a light channel 62 whereby when one or more of the LEDs in the group is on, light emanating from the light source 18 is directed at only one translucent pattern 52. The light channels 62 may be formed by walls 64 extending between the PCB 56 and the touch pad substrate 48. The light source 18 may be in modular form so that it can be used on various products, lighting different translucent patterns 52 in multiple colours, simultaneously. For example, the same translucent pattern 52 may be illuminated in blue or red depending on the function status.

Optionally, a lens or light diffuser may be positioned between the light source 18 and the translucent pattern 52 to control the light path.

Each switch 24 can be individually activated by a user pressing the touch panel 10 in the vicinity of the illuminated icon 22 to provide an output signal capable of performing a function. For example, if a user were to press an illuminated icon 22 on the panel 10 then the module detector 40 detects that trigger and provides an output signal, which subsequently turns on a light or any other function that can be controlled via an electrical signal.

In use, the first touch by a user on the front surface 14 of the panel 10 forms a capacitor between the conductive translucent layer 16 and the user's finger. The resultant capacitance change brought about by the user's interaction is detected by the detector 40 and the resultant output signal from the device is used to illuminate the required LED light sources 18. It will be appreciated that this "first touch on" function may not strictly rely on deflection based capacitive activation. The light from the light source 18 then passes through the translucent touch pad 44 and translucent pattern 52. The light passing through the translucent pattern 52 is then projected through the conductive translucent layer 16 and illuminated icons 22 become visible to the user looking at the front surface 14 of the panel 10. When all nominated icons 22 are visible the user can then touch an individual icon 22 at its discrete location. The touch will result in deflection of the capacitive switch 24 which is detected by the detector 40, as described previously, and a corresponding signal is then used to control a function, such as switching on a light or any other function that can be controlled via an electrical signal.

Other embodiments of the touch panel 10 are also envisaged in which all icons could be illuminated by powering on the touch panel 10. Alternative embodiments can include icons 22 without touch switch functionality but hidden until illuminated, a combination of hidden until illuminated icons, icons with switch functionality, or icons that are illuminated constantly.

The panel 10 is especially suited to applications in which a 'dead' frontal appearance and continuous metal-look finish is desired in combination with hidden until illuminated icons with touch detection capability. For example, the panel 10 could be used in automotive interiors or white goods appliances where an 'uncluttered' look is desired.

It will be appreciated by those skilled in the art that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention as set forth and defined by the following claims.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

The invention claimed is:

1. A capacitive touch panel comprising a transparent or translucent panel substrate, a front surface of the substrate comprising a continuous conductive transparent or translucent metal layer, which, in use, is visible to a user; at least one light source associated with a back surface of the substrate, wherein said light source is switchable between an 'on' state in which an illuminated icon is visible on the front surface of the panel and an 'off' state in which the illuminated icon is not visible on the front surface of the panel;

wherein the light transmission of the conductive transparent or translucent metal layer is from 5% to 20%.

2. The capacitive touch panel according to claim 1, further comprising at least one switch associated with the back surface of the substrate.

3. The capacitive touch panel according to claim 2, wherein the switch is able to be activated by a user pressing the touch panel in the vicinity of an illuminated icon to provide an output signal capable of performing a function.

4. The capacitive touch panel according to claim 3, wherein the switch is a capacitive switch that is activated by the deflection of a surface.

5. The capacitive touch panel according to claim 1, wherein the conductive transparent or translucent metal layer is formed from a metal, alloy or conductive metalloid selected from the group consisting of chromium, aluminium, titanium, nickel, molybdenum, zirconium, tungsten, niobium, tantalum, cobalt, manganese, silver, zinc, silicon, mixtures of any of the aforementioned, oxides of any of the aforementioned, nitrides of any of the aforementioned, borides of any of the aforementioned, carbides of any of the aforementioned, alloys of any of the aforementioned metals, steel, stainless steel, silicon.

6. The capacitive touch panel according to claim 1, wherein the front surface of the substrate has a substantially uniform appearance with no visible icons or marks when the light source is in the off state.

7. The capacitive touch panel according to claim 1, wherein the light source is switchable from the off state to the on state by a detected change in capacitance resulting from an object capacitively coupling with the conductive transparent or translucent metal layer.

8. The capacitive touch panel according to claim 1, wherein the front surface is a textured or machined surface.

9. The capacitive touch panel according to claim 1, wherein the front surface is a curved or flat surface.

10. The capacitive touch panel according to claim 2, wherein each switch is associated with a separate light source.

11. The capacitive touch panel according to claim 10, wherein the light source associated with each switch is one or more light emitting diodes (LEDs).

12. The capacitive touch panel according to claim 11, wherein a change in intensity and/or colour of the light from the LED is used to indicate that an associated switch has been activated.

13. The capacitive touch panel according to claim 1, wherein the light source is located in a light channel, which, when the light source is on, directs light towards the back surface of the substrate.

14. The capacitive touch panel according to claim 2, wherein different levels of switch activation can occur depending on the level of force applied by a user.

15. An article comprising the capacitive touch panel according to claim 1.

16. The article according to claim 15, wherein the article is an automotive interior panel or device.

17. An apparatus comprising the capacitive touch panel according to claim 1.

18. The apparatus according to claim 17, wherein the apparatus is a household appliance or white good.

19. A capacitive touch panel comprising a transparent or translucent panel substrate, a front surface of the substrate comprising a continuous conductive transparent or translucent metal layer, which, in use, is visible to a user; at least one light source associated with a back surface of the substrate, wherein said light source is switchable between an 'on' state in which an illuminated icon is visible on the front surface of the panel and an 'off' state in which the illuminated icon is not visible on the front surface of the panel;
 further comprising at least one switch associated with the back surface of the substrate, wherein each switch is associated with a separate light source.

20. The capacitive touch panel according to claim 19, wherein the light source associated with each switch is one or more light emitting diodes (LEDs).

* * * * *